United States Patent
Lai et al.

(10) Patent No.: US 9,048,149 B2
(45) Date of Patent: Jun. 2, 2015

(54) SELF-ALIGNMENT STRUCTURE FOR WAFER LEVEL CHIP SCALE PACKAGE

(71) Applicant: Taiwan Semiconductor Manufacturing Co., LTD., Hsinchu (TW)

(72) Inventors: Yu-Chia Lai, Zhunan Township, Miaoli County (TW); Hsien-Ming Tu, Zhubei (TW); Tung-Liang Shao, Hsinchu (TW); Hsien-Wei Chen, Hsinchu (TW); Chang-Pin Huang, Yangmei (TW); Ching-Jung Yang, Pingzhen (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 13/940,626

(22) Filed: Jul. 12, 2013

(65) Prior Publication Data

US 2015/0014846 A1    Jan. 15, 2015

(51) Int. Cl.
*H01L 23/00* (2006.01)

(52) U.S. Cl.
CPC ............ *H01L 24/13* (2013.01); *H01L 24/11* (2013.01)

(58) Field of Classification Search
CPC .............. H01L 2224/02166; H01L 24/13; H01L 24/11; H01L 2224/02125; H01L 2224/02126; H01L 2224/0214; H01L 2224/02141; H01L 2224/02145; H01L 2224/0215; H01L 2224/02165
USPC ................... 257/737, 773, 779, 780, 781
See application file for complete search history.

(56) References Cited

U.S. PATENT DOCUMENTS

| | | | |
|---|---|---|---|
| 2003/0218246 A1* | 11/2003 | Abe et al. | 257/734 |
| 2011/0254154 A1* | 10/2011 | Topacio et al. | 257/737 |
| 2012/0306070 A1* | 12/2012 | Yew et al. | 257/737 |

* cited by examiner

*Primary Examiner* — Peniel M Gumedzoe
(74) *Attorney, Agent, or Firm* — Maschoff Brennan

(57) ABSTRACT

A packaged semiconductor device includes a semiconductor substrate, a metal pad, a metal base, a polymer insulating layer, a copper-containing structure and a conductive bump. The metal pad and the metal base are disposed on the semiconductor substrate. The polymer insulating layer overlies the metal base and the semiconductor substrate. The copper-containing structure is disposed over the polymer insulating layer, and includes a support structure and a post-passivation interconnect (PPI) line. The support structure is aligned with the metal base. The PPI line is located partially within the support structure, and extends out through an opening of the support structure, in which a top of the support structure is elevated higher than a top of the PPI line. The conductive bump is held by the support structure.

20 Claims, 14 Drawing Sheets

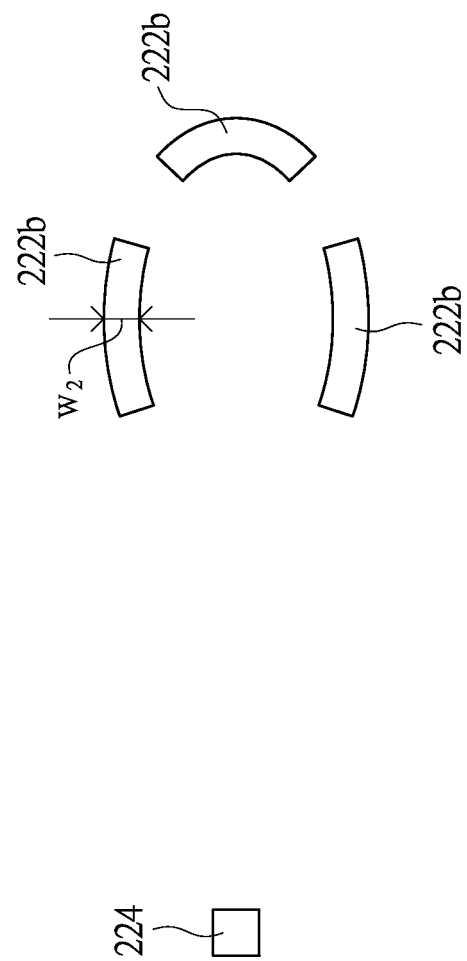

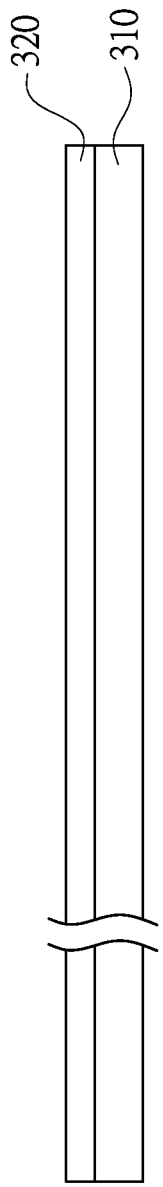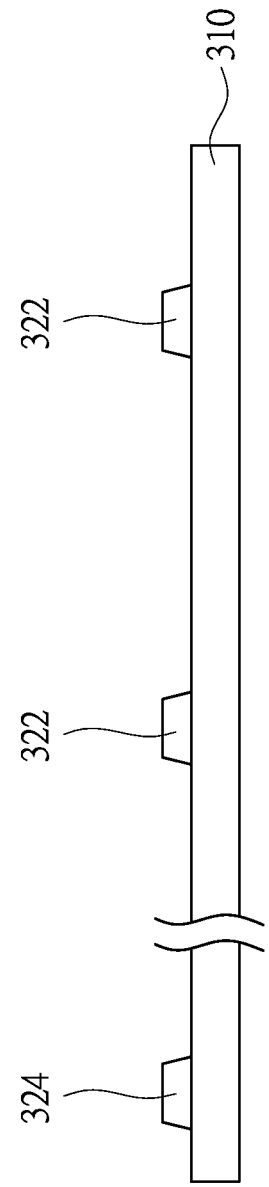

SELF-ALIGNMENT STRUCTURE FOR WAFER LEVEL CHIP SCALE PACKAGE

BACKGROUND

Wafer-level packaging (WLP) is to package an integrated circuit (IC) at wafer level, which is essentially a true chip scale package (CSP) technology, because the resulting package is practically of the same size as the die. In general, the formation of a packaged semiconductor device with under-bump metallurgy (UBM) between a solder bump and a redistribution line (RDL) requires three or four lithographic level masks, and has higher fabrication cost. A packaged semiconductor device containing no UBM between a solder bump and a RDL can lower fabrication cost, because only two lithographic level masks are required for manufacturing the UBM-free packaged semiconductor device. However, in the UBM-free packaged semiconductor device, the solder bumps (balls) are directly mounted on the RDLs, and thus a ball shift problem is likely to be caused during a ball mount process. The ball shift problem results in an inclined printed circuit board mounted on the solder bumps, and degrades the board-level temperature cycling (TC) performance of the device, thus inducing low yield of the ball mount process.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 2E is a schematic top view of another exemplary metal base shown in FIG. 2A;

FIG. 3A-FIG. 3G are schematic cross-sectional views of intermediate stages showing a method for fabricating a packaging structure in accordance with some embodiments.

DETAILED DESCRIPTION OF ILLUSTRATIVE EMBODIMENTS

Figure 1A:
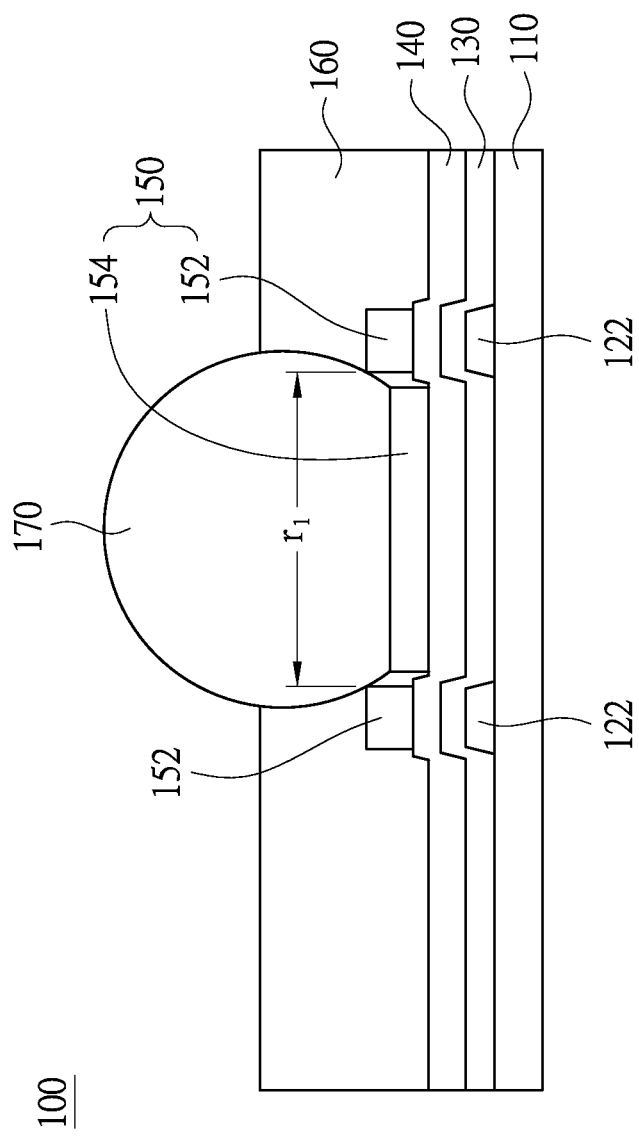
FIG. 1A is a schematic cross-sectional view of a packaging structure for various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed. When a layer is referred to as being on another layer or "on" a substrate, it may be directly on the other layer or on the substrate, or intervening layers may also be present. Throughout this disclosure, the term "copper (Cu) post" refers to a copper protrusion, a copper pillar, a thick copper pad and/or a copper-containing protrusion. As used throughout this disclosure, the term "copper" or "copper-containing" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Embodiments of the present disclosure are directed to providing a copper support structure to hold a conductive bump. The conductive bump can be held firmly on the copper support structure, thus avoiding a ball shift problem to increase the yield of a ball mount process and enhance the board-level TC performance for a device, such as a low-cost UBM-free packaged semiconductor device. However, embodiments of the present disclosure are also applicable to other types of packaged semiconductor devices, for example, a packaged semiconductor device with UBM and/or copper posts. In some embodiments, the cooper support structure is formed in the same mask with a RDL, and is raised by a metal base which is formed in the same mask with a metal pad. No additional masks are needed for constructing the copper support structure, thus not significantly increasing the fabrication cost.

FIG. 1A is a schematic cross-sectional view of a packaging structure for various embodiments. As shown in FIG. 1A, a packaging structure 100 includes a semiconductor substrate 110, a metal base 122, a polymer insulating layer 140, a copper-containing structure 150, an encapsulation layer 160 and a conductive bump 170. The semiconductor substrate 110 is defined as any construction including semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. In some embodiments, the metal base 122 includes aluminum (Al), copper (Cu), silver (Ag), gold (Au), nickel (Ni), tungsten (W), alloys thereof, and/or multi-layers thereof. A passivation layer 130, such as silicon nitride or silicon oxide, may overlie the semiconductor substrate 110 and the metal base 122, such that portions of the passivation layer 130 overlying the metal base 122 are raised.

The polymer insulating layer 140 overlies the passivation layer 130, such that portions of the polymer insulating layer 140 overlying the raised portions of the passivation layer 130 are also raised. In some embodiments, the polymer insulating layer 140 includes an epoxy, polyimide, benzocyclobutene (BCB), polybenzoxazole (PBO), or the like. The copper-containing structure 150 is disposed over the polymer insulating layer 140. The copper-containing structure 150 includes a support structure 152 and a post-passivation interconnect (PPI) line 154. The PPI line 154 may also function as a power line, a RDL, an inductor, a capacitor or any passive component. The PPI line 154 is located partially within the support structure 152. In other words, a portion of the PPI line 154 is surrounded by the support structure 152. The conductive bump 170, such as a Sn/Pb or Sn/Ag solder bump, is disposed over the PPI line 154 and is held by the support structure 152. The encapsulation layer 160 encapsulates the copper-containing structure 150 and a portion of the conductive bump 170. In some embodiments, the encapsulation layer 160 is formed from a liquid molding compound or a transfer molding compound.

The support structure 152 overlies the raised portions of the polymer insulating layer 140, and is aligned with the metal base 122. The support structure 152 is elevated higher than the PPI line 154 by about a thickness of the metal base 122. The support structure 152 and the PPI line 154 are of about the same thickness. However, in some embodiments, the thickness of the support structure 152 may be greater than that of the PPI line 154 when no metal base 122 is disposed underneath. In other words, as long as a top of the support structure 152 is elevated sufficiently higher than a top of the PPI line 154, the height difference between the support structure 152 and the PPI line 154 is enough to hold the conductive bump 170 firmly with or without the metal base 122 disposed underneath. In some embodiments, the support structure 152 may be a copper ring with an inner diameter r1 or at least three copper blocks defining a plane, such as a circular plane with an inner diameter r1, for example, about 200 μm.

Figure 1B:
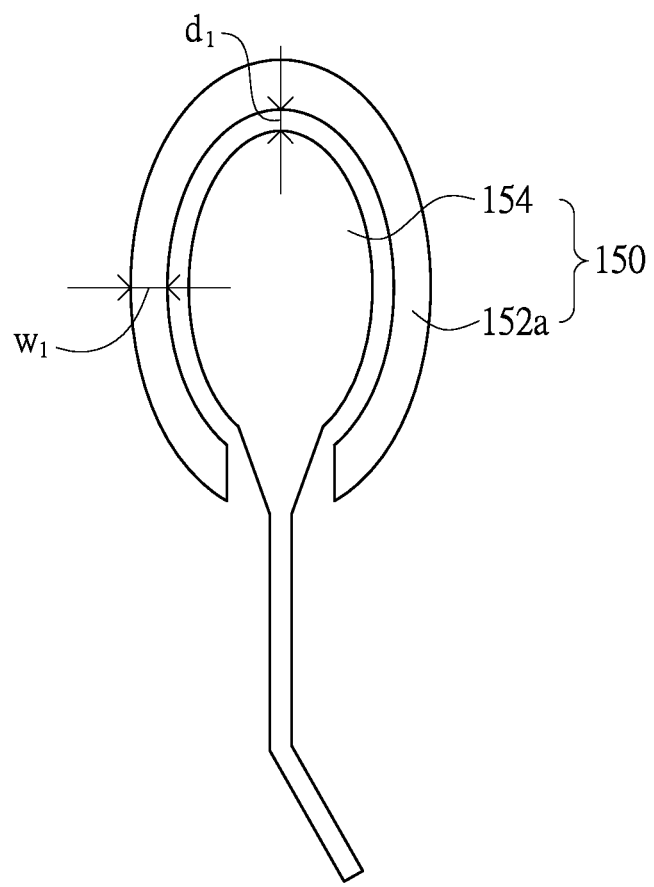
FIG. 1B is a schematic top view of an exemplary copper-containing structure shown in FIG. 1A.
Figure 1C:
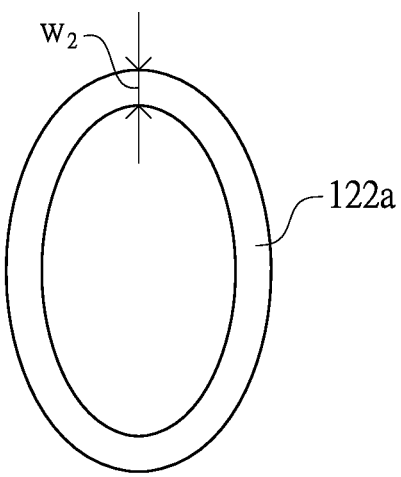
FIG. 1C is a schematic top view of an exemplary metal base shown in FIG. 1A.

FIG. 1B and FIG. 1C are schematic top views of a copper-containing structure 150 and an metal base 122 shown in FIG. 1A, according to some embodiments. As shown in FIG. 1B, the support structure of the copper-containing structure 150 is a copper ring 152a with an opening, and the PPI line 154 is located partially within the copper ring 152a and extends out through the opening. The copper ring 152a is spaced from the PPI line 154 at a distance d1. In some embodiments, the distance d1 ranges from about 10 μm to about 20 μm, and the width w1 of the copper ring 152a ranges from about 10 μm to about 20 μm. The distance d1 provides a non-wetting area between the copper ring 152a and the PPI line 154. In certain embodiments, the distance d1 can be 0, meaning that the PPI line 154 can be connected to the copper ring 152a. As shown in FIG. 1C, the metal base 122 of FIG. 1A is a metal ring 122a, such as an aluminum ring. In some embodiments, the width w2 of the metal ring 122a ranges from about 10 μm to about 20 μm.

Figure 1D:
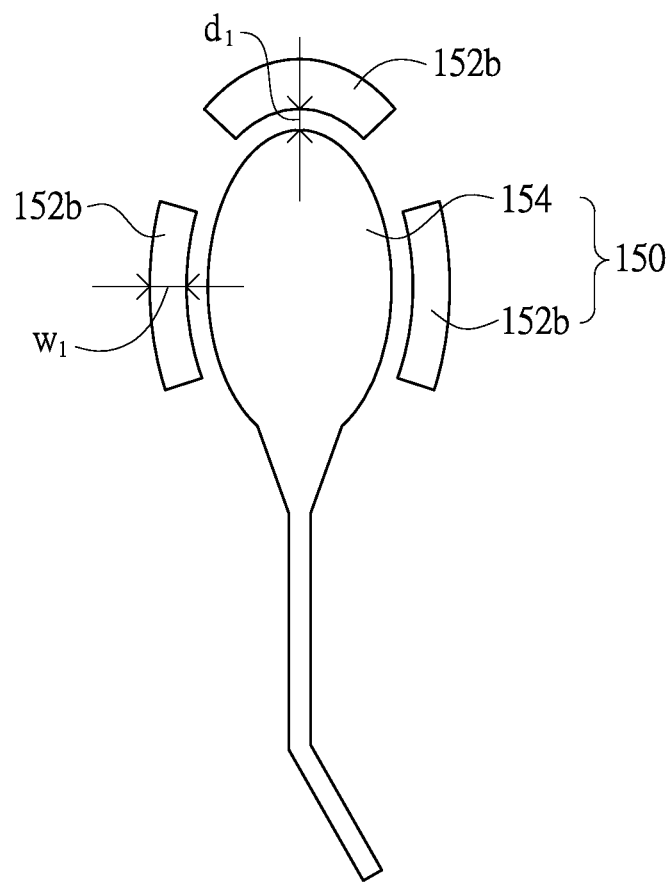
FIG. 1D is a schematic top view of another exemplary copper-containing structure shown in FIG. 1A.
Figure 1E:
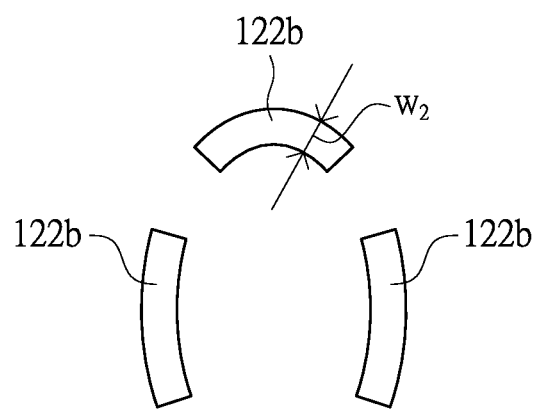
FIG. 1E is a schematic top view of another exemplary metal base shown in FIG. 1A.

FIG. 1D and FIG. 1E are schematic top views of an copper-containing structure 150 and an metal base 122 shown in FIG. 1A, according to some embodiments. As shown in FIG. 1D, the support structure of the copper-containing structure 150 is constructed from at least three copper blocks 152b defining a plane for holding the conductive bump. The PPI line 154 is located partially within the plane and extends out through an opening between two adjacent copper blocks 152b. The copper blocks 152b are spaced from the PPI line 154 at a distance d1. In some embodiments, the distance d1 ranges from about 10 μm to about 20 μm, and the width w1 of each copper block 152b ranges from about 10 μm to about 20 μm. A semiconductor fab customer may specify the shape and size of the PPI line 154 to achieve desirable electrical properties. The distance d1 provides a non-wetting area between the copper blocks 152b and the PPI line 154 to define the shape and size of the PPI line 154 as those in the customer specification that does not include copper blocks 152b. In certain embodiments, the distance d1 can be 0; meaning that the copper blocks 152b and the PPI line 154 can be connected together. As shown in FIG. 1E, the metal base is constructed from at least three metal blocks 122b, such as aluminum blocks. In some embodiments, the width w2 of each metal block 122b ranges from about 10 μm to about 20 μm.

Figure 2A:
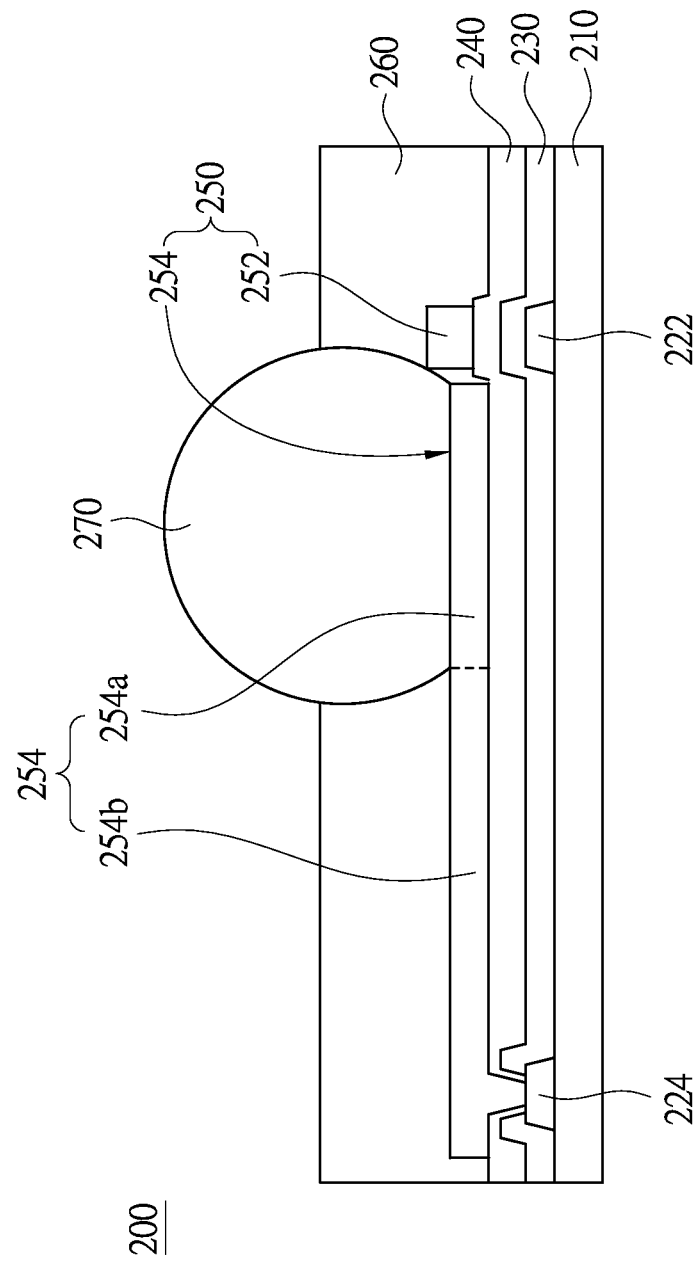
FIG. 2A is a schematic cross-sectional view of a packaging structure for some embodiments.

FIG. 2A is a schematic cross-sectional view of a packaging structure for some embodiments. As shown in FIG. 2A, a packaging structure 200 includes a semiconductor substrate 210, a metal base 222, a metal pad 224, a polymer insulating layer 240, a copper-containing structure 250, an encapsulation layer 260 and a conductive bump 270. The semiconductor substrate 210 is defined as any construction including semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. In some embodiments, the metal base 222 and the metal pad 224 include aluminum (Al), copper (Cu), silver (Ag), gold (Au), nickel (Ni), tungsten (W), alloys thereof, and/or multi-layers thereof. A passivation layer 230, such as silicon nitride or silicon oxide, may overlie the semiconductor substrate 210, the metal base 222 and the metal pad 224. An opening in the passivation layer 230 exposes a portion of the metal pad 224. Portions of the passivation layer 230 overlying the metal base 222 are raised. The polymer insulating layer 240 overlies the passivation layer 230. An opening in the polymer insulating layer 240 exposes the portion of the metal pad 224. Portions of the polymer insulating layer 240 overlying the portions of the passivation layer 230 are raised. In some embodiments, the polymer insulating layer 240 includes an epoxy, polyimide, BCB, PBO, or the like.

The copper-containing structure 250 is disposed over the polymer insulating layer 240 and the exposed portion of the metal pad 224. The copper-containing structure 250 includes a support structure 252 and a PPI line 254. The PPI line 254 includes a first portion 254a and a second portion 254b. The first portion 254a is located within the support structure 252, and the second portion 254b extends out through an opening of the support structure 252. In some embodiments, the PPI line 254 is a RDL electrically connected to the metal pad 224. The conductive bump 270, such as a Sn/Pb or Sn/Ag solder bump, is disposed over the first portion 254a of the PPI line 254 and is held by the support structure 252. The encapsulation layer 260 encapsulates the copper-containing structure 250 and a portion of the conductive bump 270. In some embodiments, the encapsulation layer 260 is formed of a liquid molding compound or a transfer molding compound.

The support structure 252 overlies the raised portions of the polymer insulating layer 240, and is aligned with the metal base 222. The support structure 252 is elevated higher than the PPI line 254 by about a thickness of the metal base 222, in which the support structure 252 and the PPI line 254 are of about the same thickness. In some embodiments, the support structure 252 may be a copper ring with an inner diameter r1 or at least three copper blocks defining a plane, such as a circular plane with a diameter r1, for example, about 200 μm.

Figure 2B:
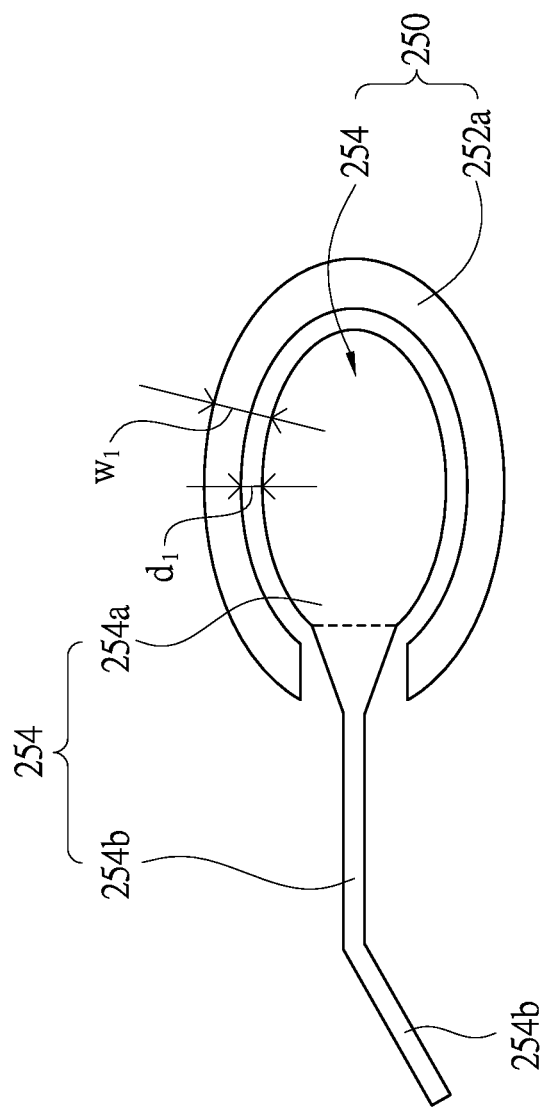
FIG. 2B is a schematic top view of an exemplary copper-containing structure shown in FIG. 2A.
Figure 2C:
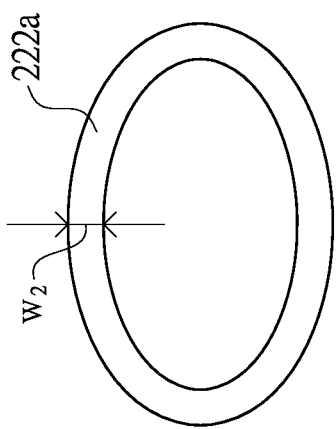
FIG. 2C is a schematic top view of an exemplary metal base shown in FIG. 2A.
Figure 2C:
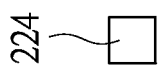

FIG. 2B and FIG. 2C are schematic top views of an exemplary copper-containing structure and an exemplary metal base shown in FIG. 2A. As shown in FIG. 2B, the support structure of the copper-containing structure 250 is a copper ring 252a with an opening, and the first portion 254a of the PPI line 254 is located within the copper ring 252a, and the second portion 254b of the PPI line 254 extends out through the opening. The copper ring 252a is spaced from the first portion 254a of the PPI line 254 at a distance d1. In some embodiments, the distance d1 ranges from about 10 μm to about 20 μm, and the width w1 of the copper ring 252a ranges from about 10 μm to about 20 μm. The distance d1 provides a non-wetting area between the copper ring 252a and the PPI line 254, such that the PPI line 254 can meet the customer specification in which no copper ring 252a is designed. In certain embodiments, the distance d1 can be 0, meaning that the PPI line 254 can be connected to the copper ring 252a. As shown in FIG. 2C, the metal base is a metal ring 222a, such as an aluminum ring. In some embodiments, the width w2 of the metal ring 222a ranges from about 10 µm to about 20 µm.

Figure 2D:
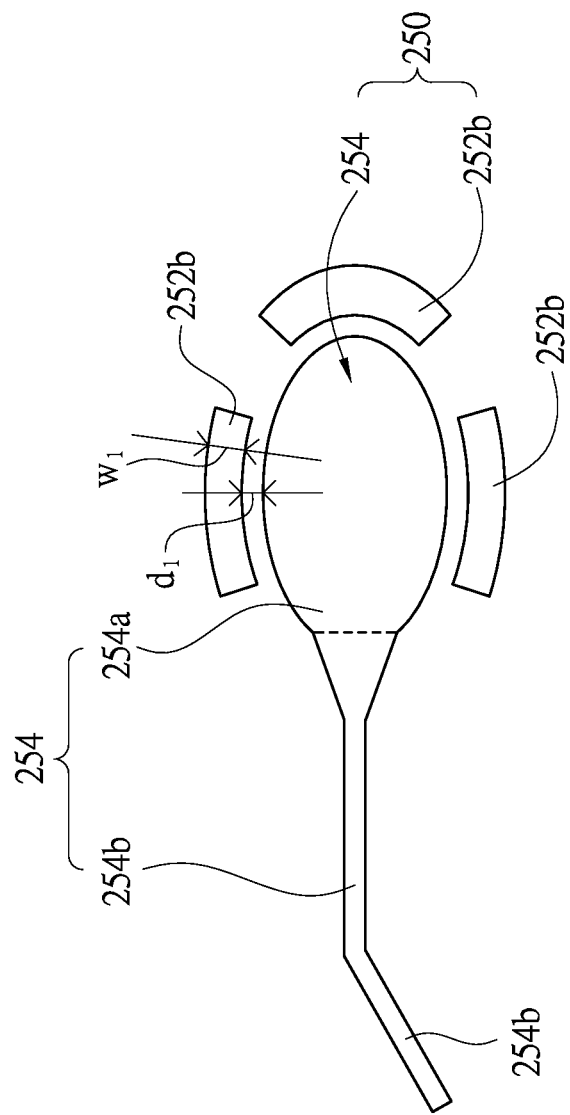
FIG. 2D is a schematic top view of another exemplary copper-containing structure shown in FIG. 2A.

FIG. 2D and FIG. 2E are schematic top views of another exemplary copper-containing structure and another exemplary metal base shown in FIG. 2A. As shown in FIG. 2D, the support structure of the copper-containing structure 250 is constructed from at least three copper blocks 252b defining a plane for holding the conductive bump. The first portion 254a of the PPI line 254 is located within the copper blocks 252b, and the second portion 254b of the PPI line 254 extends out through an opening between two adjacent copper blocks 252b. The copper blocks 252b are spaced from the PPI line 254 at a distance d1. In some embodiments, the distance d1 ranges from about 10 µm to about 20 µm, and the width w1 of each copper block 252b ranges from about 10 µm to about 20 µm. The distance d1 provides a non-wetting area between the copper blocks 252b and the PPI line 254, such that the PPI line 254 can meet the customer specification in which no copper blocks 252b are designed. In certain embodiments, the distance d1 can be 0; meaning that the copper blocks 252b and the PPI line 254 can be connected together. As shown in FIG. 2E, the metal base is constructed from at least three metal blocks 222b, such as aluminum blocks. In some embodiments, the width w2 of each metal block 222b ranges from about 10 µm to about 20 µm.

Figure 3C:
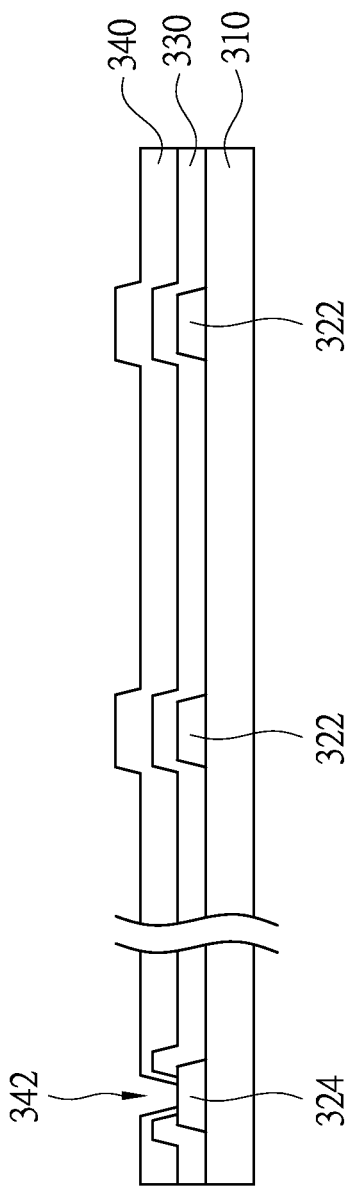

FIG. 3A-FIG. 3G are schematic cross-sectional views of intermediate stages showing a method for fabricating a packaging structure in accordance with some embodiments, in which cut lines are used to show the stages for fabricating a support structure with a first portion of a PPI line and a second portion of the PPI line. As shown in FIG. 3A, a metal layer 320 is deposited on a semiconductor substrate 310. In some embodiments, the metal layer 320 includes aluminum (Al), copper (Cu), silver (Ag), gold (Au), nickel (Ni), tungsten (W), alloys thereof, or multi-layers of these. As shown in FIG. 3B, the metal layer 320 is patterned with one mask to form a metal pad 324 and a metal base 322 on the semiconductor substrate 310. As shown in FIG. 3C, a passivation layer 330, such as silicon nitride or silicon oxide, is formed over the semiconductor substrate 310, the metal base. Portions of the passivation layer 330 are raised by the metal base 322. A polymer insulating layer 340 is formed over the passivation layer 330. Portions of the polymer insulating layer 340 are also raised by the raised portions of the passivation layer 330. In some embodiments, the polymer insulating layer 340 includes an epoxy, polyimide, BCB, PBO, or the like. An opening 342 passing through the passivation layer 330 and the polymer insulating layer 340 is formed to expose a portion of the metal pad 324.

Figure 3D:
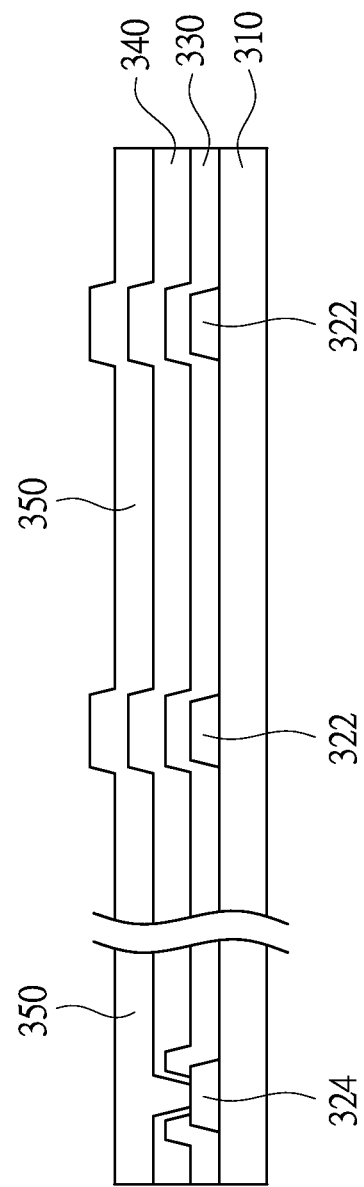
Figure 3E:
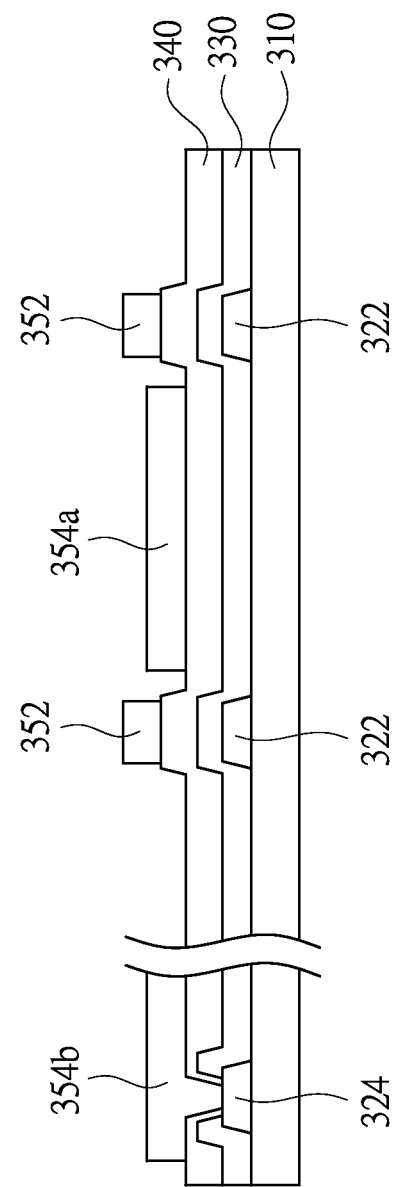

As shown in FIG. 3D, a copper-containing layer 350 is deposited in the opening 342 and over the polymer insulating layer 340. Portions of the copper-containing layer 350 are also raised by the raised portions of the polymer insulating layer 340. The methods for depositing the copper-containing material include sputtering, printing, electro plating, electroless plating, or chemical vapor deposition (CVD) methods. For example, electro-chemical plating (ECP) may be carried out to deposit the copper-containing material. Then, the copper-containing layer 350 is patterned with one mask to form a support structure 352, a first portion 354a of a PPI line in the support structure 352, and a second portion 354b of the PPI line, as shown in FIG. 3E. In some embodiments, the second portion 354b of the PPI line is a RDL electrically connected to the exposed portion of the metal pad 324. In certain embodiments, the portion 354b of the PPI line is a passive component. The support structure 352 is aligned with the meal base 322. The support structure 352 may be a copper ring as shown in FIG. 2B or constructed from at least three copper blocks as shown FIG. 2D. The metal base 322 may be a metal ring as shown in FIG. 2C or constructed from at least three metal blocks as shown FIG. 2E.

Figure 3F:
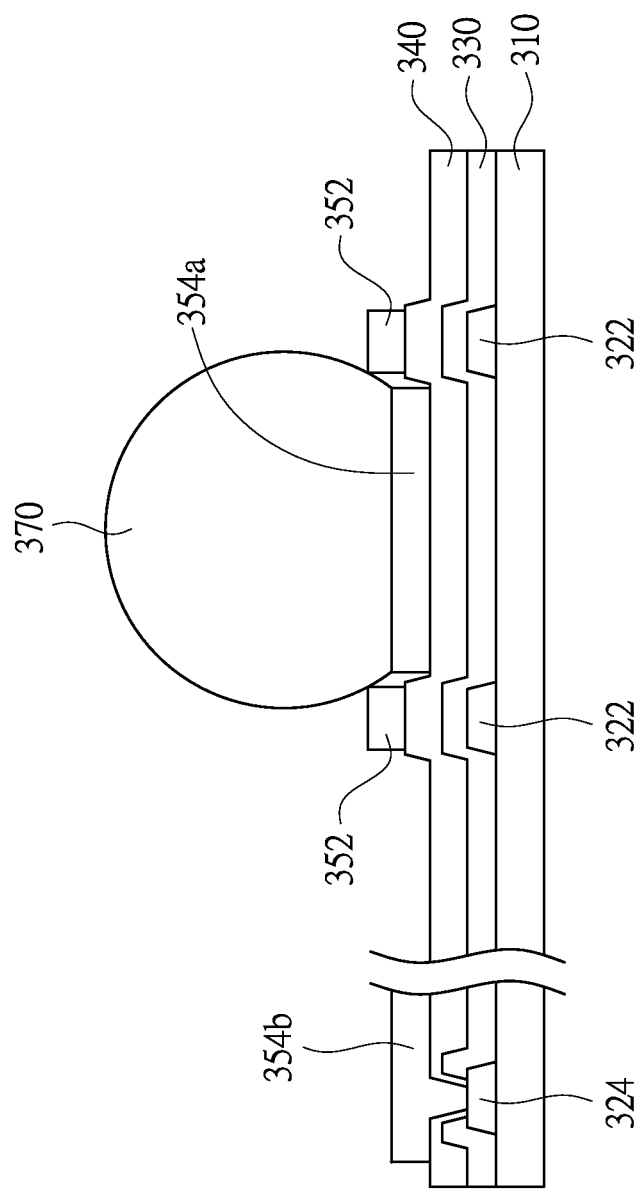
Figure 3G:
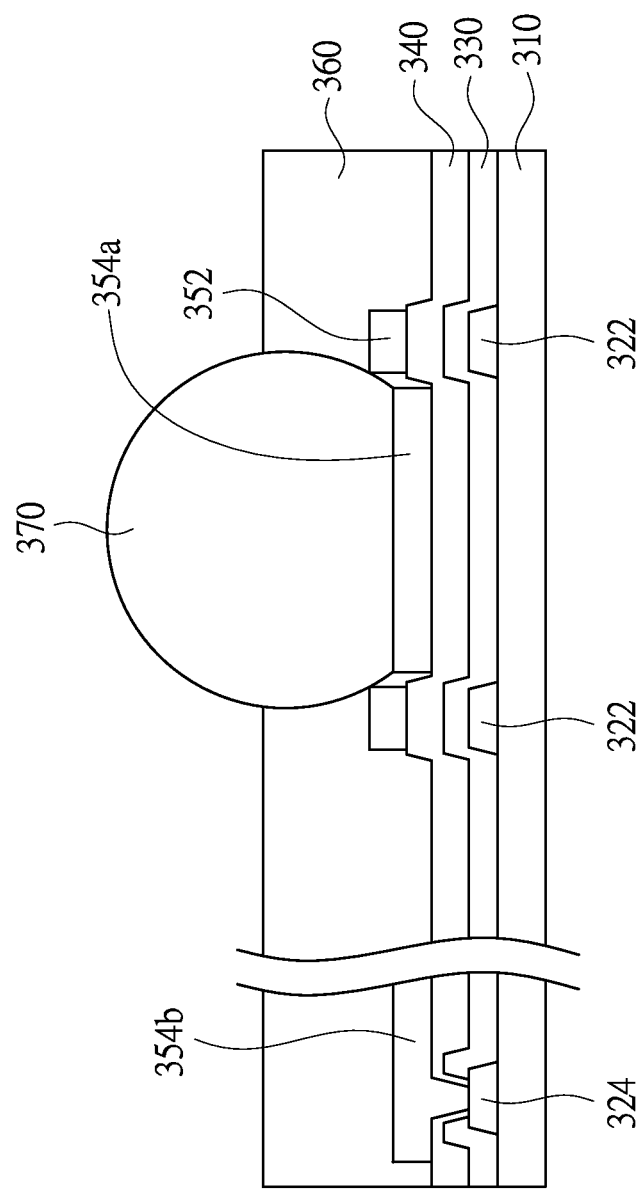

As shown in FIG. 3F, a conductive bump 370 is formed on the support structure 352 and contacts a portion 354a of the PPI line 354. The conductive bump 370 can be held firmly by the support structure 352, and thus the ball shift problem can be avoided. As shown in FIG. 3G, an encapsulation layer 360 is formed to encapsulate the PPI line 354, the support structure 352 and a portion of the conductive bump 370. In some embodiments, the encapsulation layer 360 is formed of a liquid molding compound or a transfer molding compound. In the aforementioned embodiments of the present disclosure, the support structure 352 and the PPI line (RDL) 354 are formed with the same mask, and the metal base 322 and the metal pad 324 are formed with the same mask, and thus the fabrication cost can be kept low.

Figure 4:
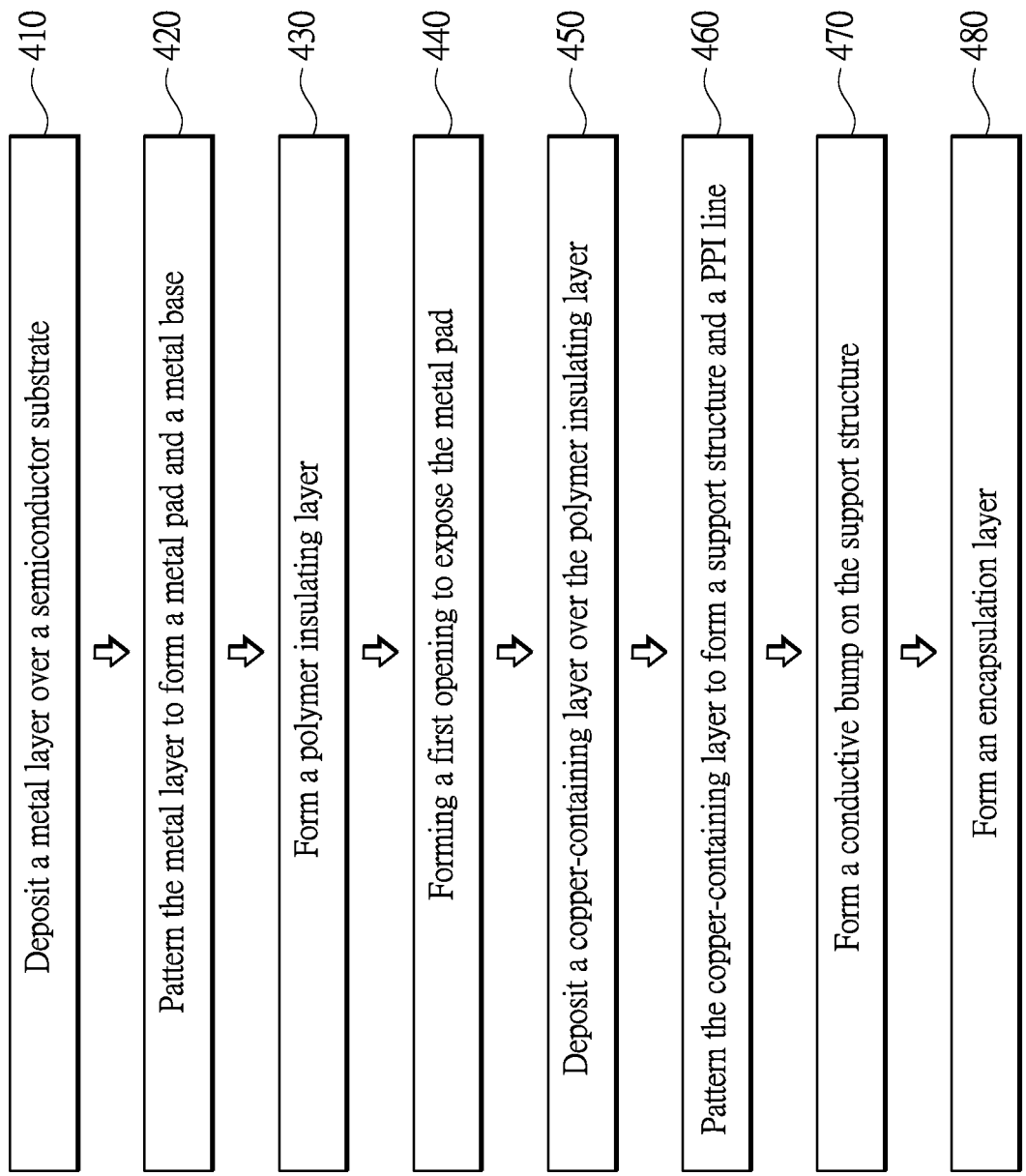
FIG. 4 is a flow chart of a method for fabricating a packaging structure in accordance with various embodiments.

Referring to FIG. 4 with FIG. 3A-FIG. 3G, FIG. 4 is a flow chart of a method for fabricating a packaging structure in accordance with various embodiments. The method begins at operation 410, where a metal layer 320 is deposited over a semiconductor substrate 310, as shown in FIG. 3A. At operation 420, the metal layer 320 is patterned to form a metal pad 324 and a metal base 322 on the semiconductor substrate 310. At operation 430, a polymer insulating layer 340 is formed over the semiconductor substrate 310, the metal pad 324 and the metal base 322, as shown in FIG. 3C. At operation 440, a first opening 342 passing through the polymer insulating layer 340 is formed to expose a portion of the metal pad 324, as shown in FIG. 3C. At operation 450, a copper-containing layer 350 is deposited over the polymer insulating layer 340, as shown in FIG. 3D. At operation 460, the copper-containing layer 350 is patterned to form a support structure 352 with a second opening and a PPI line 354 extending through the second opening, as shown in FIG. 3E and FIG. 2B or FIG. 2D. At operation 470, a conductive bump 370 is formed on the support structure 352, as shown in FIG. 3F. At operation 480, an encapsulation layer 360 is formed to encapsulate the PPI line 354, the support structure 352 and a portion of the conductive bump 370, as shown in FIG. 3G.

In accordance with an embodiment, the present disclosure discloses a device including a semiconductor substrate, a metal pad, a polymer insulating layer, a copper-containing structure and a conductive bump. The metal pad is disposed on the semiconductor substrate. The polymer insulating layer overlies the semiconductor substrate and exposes a portion of the metal pad. The copper-containing structure is disposed over the polymer insulating layer, and includes a support structure having an opening, and a PPI line. The PPI line is located partially within the support structure and extends out through the opening of the support structure, in which a top of the support structure is elevated higher than a top of the PPI line. The conductive bump is held by the support structure.

In accordance with another embodiment, the present disclosure discloses a device including a semiconductor substrate, a metal pad, a metal base, a polymer insulating layer, a copper-containing structure and a conductive bump. The metal pad and the metal base are disposed on the semiconductor substrate. The polymer insulating layer overlies the metal base and the semiconductor substrate, and exposes a portion of the metal pad. The copper-containing structure is disposed over the polymer insulating layer, and includes a support structure and a PPI line. The support structure is aligned with the metal base, and has an opening. The metal base and the support structure are of about the same width. The PPI line is located partially within the support structure, and extends out through the opening of the support structure, in which a top of the support structure is elevated higher than a top of the PPI line. The conductive bump is held by the support structure.

In accordance with yet another embodiment, the present disclosure discloses a method for forming a device. In this method, a metal layer is deposited over a semiconductor substrate, and is patterned to form a metal pad and a metal base on the semiconductor substrate. A polymer insulating layer is formed over the semiconductor substrate, the metal pad and the metal base. A first opening passing through the polymer insulating layer is formed to expose a portion of the metal pad. A copper-containing layer is deposited over the polymer insulating layer, and is patterned to form a support structure with a second opening and a PPI line extending through the second opening. A conductive bump is formed on the support structure.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
    a semiconductor substrate;
    a metal pad on the semiconductor substrate;
    a polymer insulating layer overlying the semiconductor substrate and exposing a portion of the metal pad;
    a copper-containing structure over the polymer insulating layer, the copper-containing structure comprising:
        a support structure having an opening; and
        a post-passivation interconnect (PPI) line partially within the support structure and extending out through the opening, wherein a top of the support structure is elevated higher than a top of the PPI line; and
    a conductive bump held by the support structure.

2. The device of claim 1, further comprising:
    a metal base on the semiconductor substrate, wherein the polymer insulating layer overlies the metal base, and the support structure is aligned with the metal base.

3. The device of claim 2, wherein the support structure is a copper ring, and the metal base is a metal ring.

4. The device of claim 2, wherein the support structure and the PPI line are of substantially same thickness, and the metal base and the metal pad are of substantially same thickness.

5. The device of claim 2, wherein the support structure comprises at least three copper blocks defining a plane, and the metal base comprises at least three metal blocks corresponding to the copper blocks.

6. The device of claim 1, wherein the PPI line is a redistribution line (RDL) electrically connected to the portion of the metal pad.

7. The device of claim 1, wherein the support structure is spaced from the PPI line at a distance.

8. The device of claim 7, wherein the distance ranges from 10 µm to 20 µm.

9. The device of claim 1, wherein the top of the support structure is elevated higher than the top of the PPI line by a thickness of the metal pad.

10. The device of claim 1, further comprising:
    an encapsulation layer encapsulating the copper-containing structure and a portion of the conductive bump, wherein the encapsulation layer comprises a liquid molding compound or a transfer molding compound.

11. A device, comprising:
    a semiconductor substrate;
    a metal pad and a metal base on the semiconductor substrate;
    a polymer insulating layer overlying the metal base and the semiconductor substrate and exposing a portion of the metal pad;
    a copper-containing structure over the polymer insulating layer, the copper-containing structure comprising:
        a support structure aligned with the metal base and having an opening, wherein the metal base and the support structure are of substantially same width; and
        a post-passivation interconnect (PPI) line partially within the support structure and extending out through the opening, wherein a top of the support structure is elevated higher than a top of the PPI line; and
    a conductive bump held by the support structure.

12. The device of claim 11, wherein the support structure is a copper ring, and the metal base is an aluminum ring.

13. The device of claim 11, wherein the support structure comprises at least three copper blocks defining a plane, and the metal base comprises at least three aluminum blocks corresponding to the copper blocks.

14. The device of claim 11, wherein the PPI line is a RDL electrically connected to the portion of the metal pad.

15. The device of claim 11, wherein the support structure is spaced from the PPI line at a distance.

16. The device of claim 11, wherein the width of the metal base and the support structure ranges from 5 µm to 20 µm.

17. The device of claim 15, wherein the distance ranges from 10 µm to 20 µm.

18. The device of claim 11, further comprising:
    an encapsulation layer encapsulating the copper-containing structure and a portion of the conductive bump, wherein the encapsulation layer comprises a liquid molding compound or a transfer molding compound.

19. The device of claim 13, wherein the plane is a circular plane.

20. The device of claim 11, wherein the metal base and the metal pad include aluminum (Al), copper (Cu), silver (Ag), gold (Au), nickel (Ni), tungsten (W), alloys thereof, and/or multi-layers thereof.

* * * * *